US006977522B1

(12) United States Patent
Murabayashi et al.

(10) Patent No.: US 6,977,522 B1
(45) Date of Patent: Dec. 20, 2005

(54) INTERFACE DEVICE AND INFORMATION PROCESSING SYSTEM

(75) Inventors: Fumio Murabayashi, Urizura (JP); Takashi Sase, Hitachi (JP); Mutsumi Kikuchi, Hitachi (JP); Atsuo Watanabe, Hitachiota (JP); Masatsugu Amishiro, Hitachi (JP); Kenji Tabuchi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/149,763

(22) PCT Filed: Dec. 15, 1999

(86) PCT No.: PCT/JP99/07041

§ 371 (c)(1),
(2), (4) Date: Jun. 13, 2002

(87) PCT Pub. No.: WO01/44913

PCT Pub. Date: Jun. 21, 2001

(51) Int. Cl.$^7$ .......................................... H03K 19/0175

(52) U.S. Cl. ..................... 326/62; 327/166; 327/176

(58) Field of Search ................... 326/99, 62, 63, 326/68, 82, 83; 327/100, 101, 102, 166, 176

(56) References Cited

U.S. PATENT DOCUMENTS

| 3,513,400 A | * | 5/1970 | Russell | 327/176 |
| 4,912,420 A | * | 3/1990 | Parnell | 327/78 |
| 5,870,046 A | * | 2/1999 | Scott et al. | 341/143 |

FOREIGN PATENT DOCUMENTS

| JP | 61-152193 | 9/1986 |
| JP | 8-88696 | 4/1996 |
| JP | 64-51745 | 2/1999 |
| JP | 11-136293 | 5/1999 |
| JP | 11-196136 | 7/1999 |
| JP | 11-252270 | 9/1999 |
| KP | 1996-2824 | 1/1996 |
| KP | 1999-72936 | 9/1999 |
| WO | WO 98/44687 | 10/1998 |

* cited by examiner

Primary Examiner—Daniel D. Chang
(74) Attorney, Agent, or Firm—McDermott Will & Emery LLP

(57) ABSTRACT

A first converter circuit converts a state signal, whose level is constant or slowly varies during a predetermine period of time, into a pulse signal to allow the signal to propagate across an electrically insulating area. A second converter circuit converts the pulse signal, which has propagated through an insulating circuit, into the original state signal or a signal having the same characteristics as the original state signal.

10 Claims, 10 Drawing Sheets

(a)

(b)

INTERFACE DEVICE AND INFORMATION PROCESSING SYSTEM

TECHNICAL FIELD

The present invention relates to an interface device connected between, for example, a network and an information processing system such as a personal computer or a controller.

BACKGROUND ART

Conventionally, an insulating system using a photocoupler is used for electrical insulation. This system, however, poses the problem that the current consumption is large and the system cannot be formed on the same semiconductor substrate as the peripheral circuit. A capacitor-type insulating system is described in JP-A-11-252270 as an insulating system which is smaller in current consumption and can be formed on the same semiconductor substrate as the peripheral circuit. The capacitor-type insulating system is configured of a filter including a capacitor and a resistor for cutting off the signal components in an area lower than a predetermined frequency. For signal transmission, what is called the differential transmission system is used, in which the change portion of the signal is transmitted.

In a system in which a plurality of field devices each having mounted thereon an interface device having the insulating function are connected to a network, each field device includes a power supply circuit supplied with a voltage (say, 24 V) from the network, which after voltage conversion, is supplied to the interface device itself. The power for the secondary circuit electrically insulated is supplied from another power supply on the secondary side. In this system, assume the power supply circuit of the interface device for supplying the power on the primary side runs out of order for some reason or other. The signal processing device on the secondary side, unable to know whether the circuit on the primary side is operating normally or not, continues to process the signal on the assumption that it is operating normally. Since the power supply circuit on the primary side of the network devices is out of order, on the other hand, correct information cannot be transmitted to the signal processing device on the secondary side, and in the worst case, the system is unavoidably stopped. In order to prevent this, the signal processing device on the secondary side is required to be informed whether the power supply circuit mounted on the field device on the primary side is operating correctly or not. In the conventional insulating system using the photocoupler, the output of the power supply circuit can be transmitted as it is to the secondary side through the photocoupler. In the capacitor-type insulating system, however, the output of the power supply circuit cannot be transmitted as it is as a state signal, since what is called the differential transmission system is used in which the change portion of the signal is transmitted. The state signal is defined as a signal which is maintained at high or low level and provides a significant signal in the absence of a change from high to low level or low to high level. Specifically, the change portion of the signal can be transmitted using the capacitor-type insulating system, but the state signal which remains unchanged cannot be transmitted using the capacitor-type insulating system. In an interface device using the capacitor-type insulating system, therefore, the state signal cannot be transmitted, so that the status of the power supply circuit cannot be transmitted to the secondary side. Neither the state signal such as a standby signal for controlling the primary circuit can be transmitted to the primary side from the signal processing device on the secondary side.

Secondly, the prior art consumes the power of the power supply circuit in a great amount, which poses a problem regardless of whether the devices are insulated or not. In the prior art, the series regulator has been used as a small voltage converter circuit. In the system having information processing devices connected to a network, however, the power equivalent to the number (N) of the devices connected is required to be supplied from the network. The power consumption, even though negligible for a single device, reaches an amount that cannot be ignored in a network connection. An increased power consumption increases the load on the network power supply, and the number of devices exceeding the power supply capacity cannot be connected. In other words, the problem is that the number (N) of the devices that can be connected to the network is limited.

Thirdly, in the case where the devices connected to the network are formed on a SOI (silicon on insulator) substrate, assume that the potential of the semiconductor substrate is floating. The surface-type devices operating at a voltage not higher than 5 V are not affected by the floating potential of the substrate, while the MOS transistor of high breakdown voltage type, in which current flows deep in the active layer, is easily affected by the substrate potential. In the case where the power supply circuit and the transceiver are incorporated into a single chip, the MOS transistor of surface operation type operating at a voltage not higher than 5 and the MOS transistor of high breakdown voltage are mounted together on the same semiconductor substrate. A floating substrate potential, therefore, poses the problem that the operation of the MOS transistor of high breakdown voltage becomes unstable.

DISCLOSURE OF THE INVENTION

A first object of the invention is to make it possible to propagate a state signal, whose signal level does not change or changes slowly, between the primary side and the secondary side electrically insulated from each other by a capacitor-type insulating circuit.

A second object of the invention is to provide an interface device having a power supply circuit of low power consumption in order to relax the limitation of the number of the devices connected to the network.

A third object of the invention is to eliminate the effect of the variations of the substrate potential on the MOS transistor of high breakdown voltage.

In order to achieve this object and to propagate a state signal between a first area and a second area electrically insulated from each other by a capacitor, according to the invention, a first converter circuit which converts the state signal into a pulse signal is formed in the first area. The pulse signal is propagated through the capacitor-type insulating circuit, and therefore the pulse signal converted by the converter is sent to the second area. The second area is formed with a second converter circuit which converts the pulse signal into the original state signal or a new state signal having the same characteristics as the original state signal. By doing so, the state signal generated in the first area can be propagated to the second area.

By propagating the state signal in this way, the diagnosis and control operation become possible between areas electrically insulated from each other, thereby making it possible to improve the safety and economy of devices and systems.

In order to achieve the second object, a network transceiver and a switching regulator are formed on the same semiconductor substrate. The switching regulator, due to the large power noise generated by it, is not normally formed on the same semiconductor substrate as other logic circuits. By limiting the supply current or appropriately designing a circuit for relaxing the switching noise, however, the switching regulator can be formed on the same semiconductor substrate as other logic circuits. In the prior art, the switching regulator and the logic circuits are not advantageously formed on the same semiconductor substrate in this way. In connecting a plurality of devices to a network, however, the number of the devices to be connected is limited by the power consumption per device. Of the devices connected to the network, therefore, the network transceiver and the switching regulator are formed on the same semiconductor substrate, thereby making it possible to increase the number of devices connectable to the network. The switching regulator and the network transceiver can be mounted as independent parts on the board. In such a case, however, the mounting area is increased on the one hand, and a noise is generated by the resistance and inductance added to the power lines by the wire and bonding for connecting the parts on the other hand. By forming the network transceiver and the switching regulator on the same semiconductor substrate, the function of monitoring the state of the power supply can be shared with the power supply circuit and therefore the circuit can be reduced in size.

In order to achieve the third object, the potential of the support base for the semiconductor is equalized to the potential of the base of the active layer in the first or second area insulated.

BEST MODE FOR CARRYING OUT THE INVENTION

Figure 1:
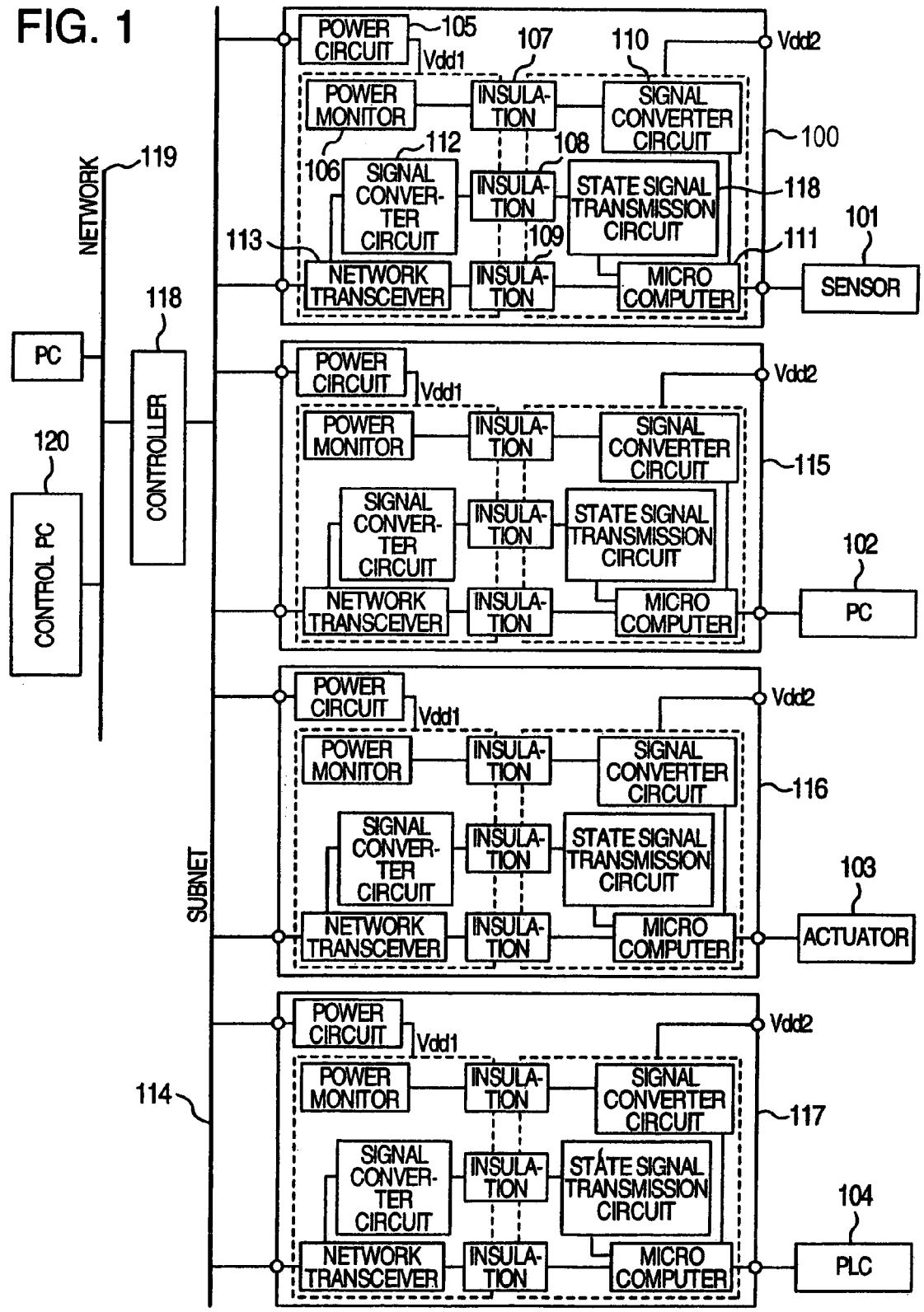
FIG. 1 is a diagram showing a configuration of the whole control system using a capacitor-type insulating circuit.

FIG. 1 shows a distributed control system according to this invention. In this distributed control system, various field devices including a sensor 101, a personal computer (PC) 102, an actuator 103 and a programmable logic controller (PLC) 104 are connected to a network 114 through interface devices 100, 115, 116, 117. The interface devices 100, 115, 116, 117 may be formed independently of the sensor 101, the personal computer 102, the actuator 103 and the programmable logic controller 104, respectively, or each field device may have an interface device built therein. The network 114 is further connected through a controller 118 to a higher-order network 119 connected with a control personal computer (control PC) 120 and the like. In addition to the configuration of the distributed control system described above, various system configurations are possible according to the hierarchy and type of the network.

In the distributed control system configured in this way, the whole system is controlled by the control personal computer 120, and the control operation is performed mutually by the field devices in the subnet. An example of the control operation in the subnet is explained. The signal detected by the sensor 101 is sent to the network 114 through the interface device 100. This signal is input to various field devices through the interface devices 115, 116, 117. For example, the personal computer 102 performs the arithmetic operation based on the output signal of the sensor 101 sent thereto, and determines whether the state of an object to be controlled is normal or abnormal. The actuator 103 and the programmable logic controller 104 regulate the control amount of an object to be controlled, based on the output of the sensor 101.

Next, the interface devices will be explained. The interface devices 100, 115, 116, 117 of the distributed control system according to this invention have the same configuration, and therefore reference will be made to only the interface device 100. The internal configuration of each interface device can be modified in accordance with the field device associated with it.

The interface device 100 includes a network transceiver 113, a power supply circuit 105, insulating circuits 107, 108, 109, a microcomputer (micro) 111, a power monitor circuit 106, and signal converter circuits 110, 112. As described above, the interface device 100 has mounted thereon the microcomputer 111 whereby the distributed control operation is made possible in the subnet. Further, the interface device 100 includes capacitor-type insulating circuits 107, 108, 109, whereby the network 114 and the sensor constituting a field device can be electrically insulated from each other. This electrical insulation prevents the propagation of an abnormal signal from the network 114 to the field devices due to lightning or the like on the one hand and prevents the propagation of an abnormal signal from the field devices to the network 114 at the same time. The power for the circuits arranged nearer to the network than the insulating circuits 107, 108, 109 of the interface device 100 is supplied from the power supply circuit 105. The power supply circuit 105 is supplied with a voltage of 24 V from the network, and converting it into a voltage of 5 V, supplies the power to the circuits, such as the network transceiver 113 and the signal converter circuit 112, arranged nearer to the network than the insulating circuits in the interface device 100. On the other hand, the microcomputer 111 and the signal converter circuit 110 arranged nearer to the field devices than the insulating circuits 107, 108, 109 of the interface device 100 are supplied with power from a power supply insulated from the network. The network transceiver 113 is for converting the signal between the network 114 and the various field devices. Further, the network transceiver 113 is adapted to assume an inoperative mode (inactive mode) and an operative mode (active mode) according to the signal applied thereto from an external source for suppressing the power consumption. The power monitor circuit 106 monitors the state of the power supply circuit 105, and in the case where the voltage output from the power supply circuit is in a predetermined range, generates a pulse signal and sends it to the insulating circuit. The pulse signal generated in the power monitor circuit 106 changes in regular fashion, and this change is transmitted to the signal converter circuit 110 through the insulating circuit 107. The signal converter circuit 110 supplied with a pulse signal converts the pulse signal to a level signal and transmits it to the microcomputer 111. In this way, the state of the power supply circuit 105 insulated is detected by the microcomputer 111.

The state signal transmitter 118 is for transmitting the state signal output from the microcomputer 111 to the network. In this case, the state signal is a standby signal for inactivating the network transceiver 113. The state signal output from the microcomputer 111 is converted into a pulse signal by the state signal transmitter circuit 118. The pulse signal is transmitted through the insulating circuit 108 to the signal converter circuit 112. The signal converter circuit 112 converts the pulse signal into a state signal thereby to control the network transceiver 113.

As described above, each interface device used in the distributed control system according to this embodiment electrically insulates the network and the various field devices from each other and exchanges the signals in two ways, while at the same time making it possible to transmit the state signal of the power supply circuit to the microcomputer insulated. Thus, the reliability of the network system as a whole is improved.

Specifically, assume that the power supply circuit of the interface device fails to operate normally for some reason or other. Naturally, no power would be supplied to the network transceivers in the interface devices, and therefore the circuit operation would be stopped. If the control operation is continued under this condition, the actuator, for example, might perform the control operation based on a wrong signal, resulting in the malfunction of the whole system or the stoppage of the whole system. Since the state of the power supply is notified to the microcomputer by the power monitor circuit of the interface device, however, the microcomputer can stop the operation of the actuator or stop the signal transmission to the network. In this way, the malfunction of the whole system or the stoppage of the whole system can be prevented, thereby improving the reliability of the system as a whole.

Further, each interface device can transmit the state signal from the microcomputer to the insulated network and control the circuits on the network. Thus, the power consumption of the whole system can be reduced.

Specifically, as long as the microcomputer outputs a voltage of 5 V as a state signal, the network transceiver is in standby mode thereby to control the current consumption downward. In the case where the microcomputer outputs 0 V, on the other hand, the network transceiver is controlled to assume the normal operation mode.

As described above, the current consumption of the network transceiver constituting an inactive field device can be suppressed by controlling the network transceiver using the standby signal from the microcomputer. Thus, the power consumption of the whole network system can be reduced.

The system reliability can be improved and the power consumption of the system can be reduced in the manner described above, by reason of the fact that each interface device is so configured that the state signal can be transmitted in two ways through the capacitor-type insulating circuit. An explanation will be given of the principle by which the state signal is transmitted in two directions through the capacitor-type insulating circuit.

Figure 2:
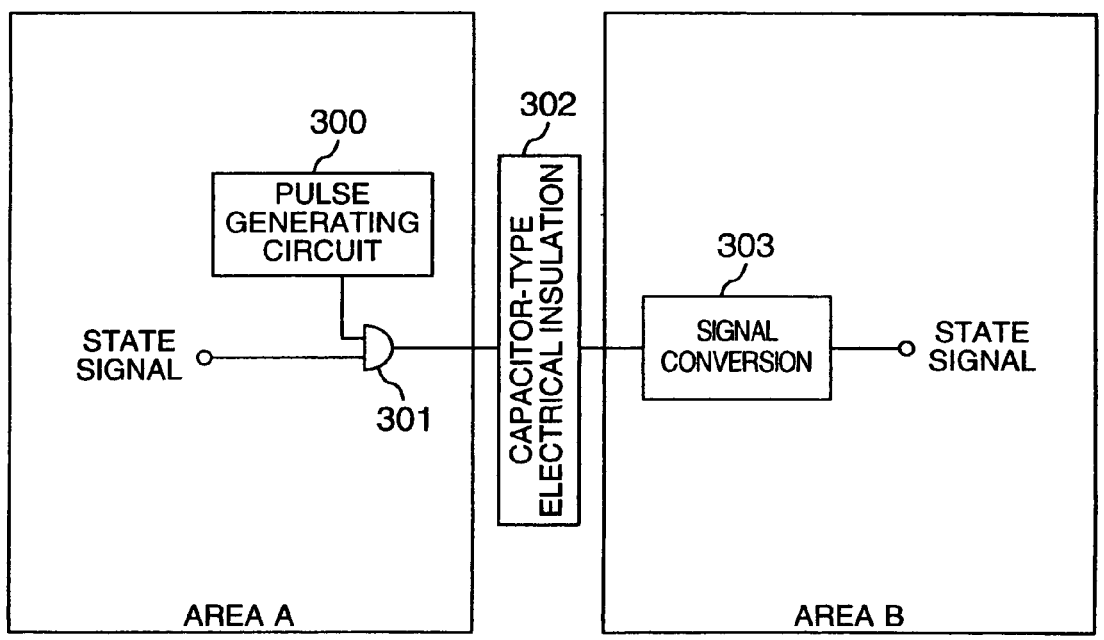
FIG. 2 is a diagram showing a basic configuration for propagating a state signal between the areas electrically insulated from each other by the capacitor-type insulating circuit.

FIG. 2 shows a basic configuration for transmitting the state signal through the capacitor-type insulating circuit. The state signal is defined as a signal indicating the status indicating whether the signal is at high or low level as described above, i.e. a signal which remains unchanged or changes slowly and is not propagated through the capacitor-type insulating circuit.

In FIG. 2, a plurality of circuits are formed or arranged in areas A and B, which are electrically insulated from each other by a capacitor. The state signal output from a given circuit in the area A is input to an AND circuit 301 together with the pulse signal output from a pulse generating circuit 300. The AND circuit 301 outputs a low-level signal when the state signal is at low level, and a pulse signal when the state signal is at high level. The capacitor-type insulating circuit 302 does not transmit the signal when the output signal of the AND circuit 301 is at low level, and transmits it when the output signal of the AND circuit 301 is a pulse signal. A signal converter circuit 303 outputs a low-level signal in response to a signal of a predetermined high or low level, and outputs a high-level signal in response to a pulse signal. In this way, the state signal is converted into a pulse signal, which is input to the insulating circuit, and the signal output from the insulating circuit is converted again into a state signal. Thus, the state signal can be mutually transmitted through the capacitor-type insulating circuit.

This configuration for electrical insulation through the capacitor-type insulating circuit has the advantage that circuit size can be reduced as compared with the case where a photocoupler or a coil is used for insulation. With this configuration, therefore, the state signal can be propagated with a reduced circuit size. Although the example of the distributed control system shown in FIG. 1 refers to the output voltage of the power supply circuit and the signal output from the microcomputer as a state signal, this configuration can transmit other state signals with equal effect.

The configuration of each part of the interface devices shown in FIG. 1 will be explained in detail below.

Figure 3:
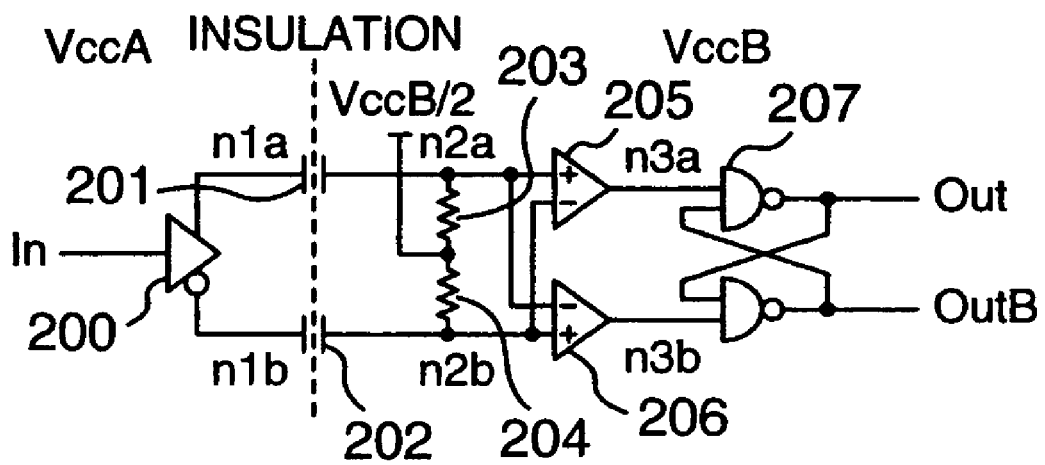
FIG. 3 is a diagram showing the configuration of the capacitor-type insulating circuit and waveforms generated at various portions.
Figure 3:
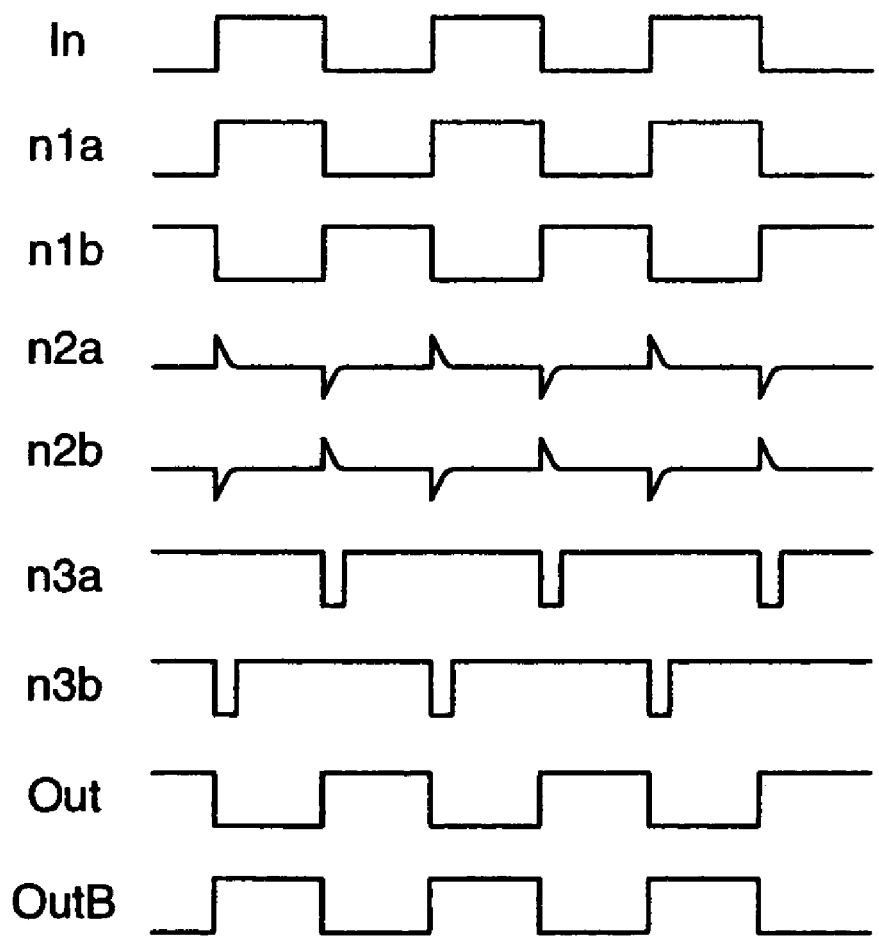

FIG. 3 shows the configuration and waveforms of a capacitor-type insulating circuit. The insulating circuit includes a buffer circuit 200 for generating complementary signals from a single signal for drive, capacitors 201, 202 having the electrically insulating function, resistors 203, 204 each making up a high-pass filter together with a capacitor, comparator circuits 205, 206 for converting by amplifying into a pulse signal the complementary differential waveforms supplied through the insulating circuit, and a flip-flop 207 for latching the output pulse signals of the comparator circuits.

The signal In from the network is input to the buffer circuit 200, wherefrom complementary signals n1$a$, n1$b$ are output. The resistors 203, 204 connected in parallel to the insulating capacitors 201, 202 make up a high-pass filter for generating differential signals n2$a$, n2$b$ in synchronism with the leading and tailing edges, respectively, of the signals n1$a$, n1$b$. These signals are input to the comparator circuits 205, 206 thereby to generate pulse signals n3$a$, n3$b$, respectively. The signals n3a, n3b are input to a RS flip-flop 207 thereby to output complementary signals Out, OutB restored from the input signal.

The capacitor-type insulating circuit configured as described above is for transmitting a differential waveform corresponding to the change at the leading and trailing edges of the signal. In this case, therefore, the state signal is defined as a signal derived from an input signal which is not changed or changed slowly and cannot be transmitted by the capacitor-type insulating circuit.

Figure 4:
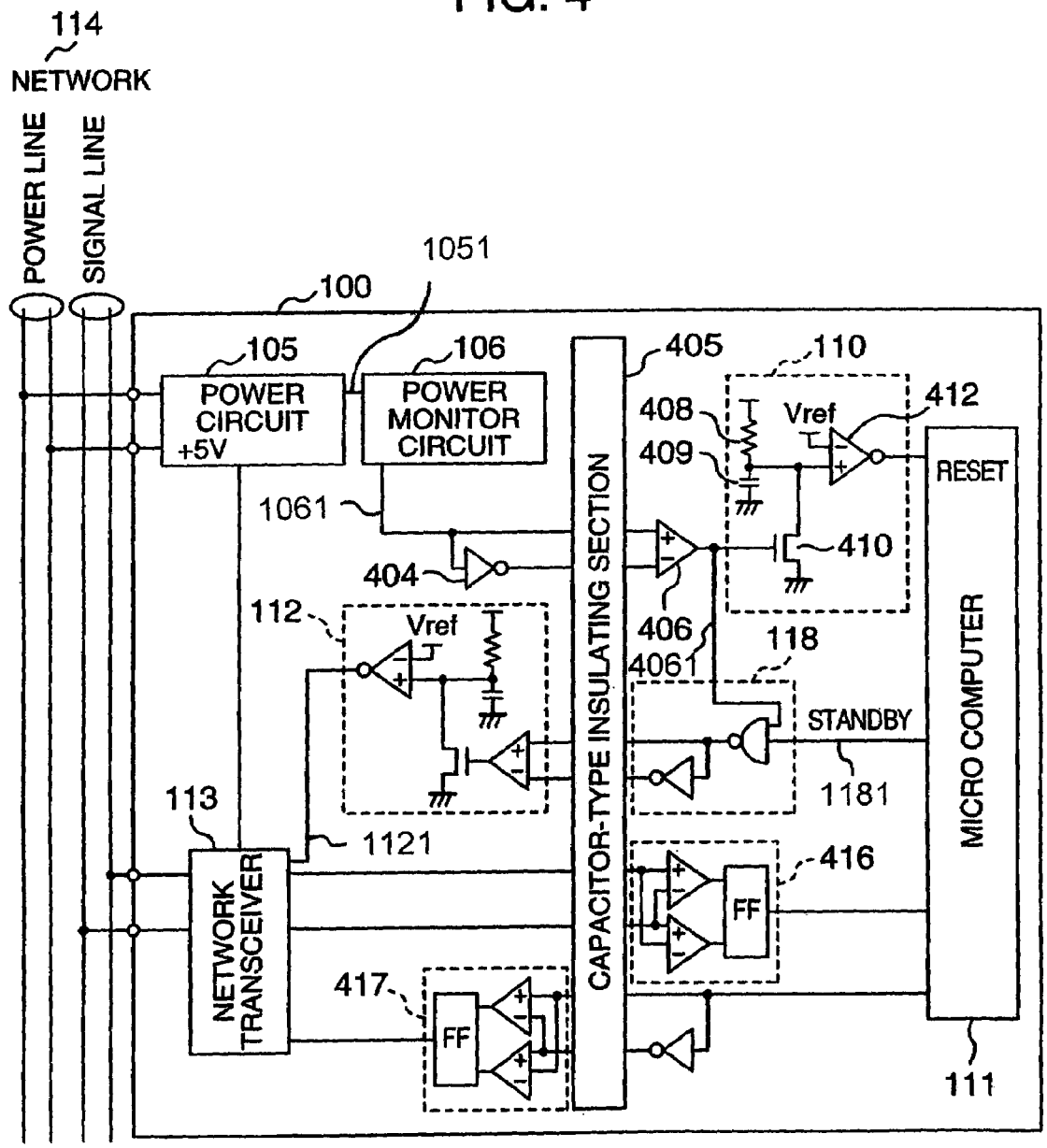
FIG. 4 is a diagram showing a detailed configuration of the interface device shown in FIG. 1.

FIG. 4 shows in detail a power monitor circuit and a transmission circuit for a standby signal in each interface device shown in FIG. 1. The interface device 100 is configured of a power supply circuit 105, a power monitor circuit 106, signal converter circuits 110, 112, a state signal transmitter circuit 118, a network transceiver 113, insulation receiving circuits 416, 417, a microcomputer 111 and a capacitor-type insulating section 405. The capacitor-type insulating section 405 is a filter portion configured of a capacitor and a resistor of the capacitor-type insulating circuit shown in FIG. 2. The interface device 400 can be mounted on the board or integrally formed on the same semiconductor substrate. A semiconductor integrated circuit requires an insulating function and a high breakdown voltage, and therefore can be integrally formed on a SIO (silicon on insulator) substrate which facilitates isolation between elements.

The power supply circuit 105 is supplied with 24 V from the network 114 and outputs by converting it into 5 V. The power monitor circuit 106 is configured of a comparator circuit, the pulse generating circuit shown in FIG. 2 and an AND circuit. The comparator circuit is supplied with the output voltage of the power supply circuit 105 and a reference voltage, outputs a high-level signal 1051 in the case where the output voltage is not lower than the reference voltage, and outputs a low-level signal 1051 in the case where the output voltage is not higher than the reference voltage (in which case, assuming that the reference voltage is 4.5 V, a high-level signal is output from the comparator when the output of the power supply circuit 105 is not lower than 4.5 V. The use of two comparators makes possible a configuration in which a high-level signal is output in the case where the output of the power supply circuit 105 is in a predetermined range). As a result, the comparator circuit outputs a low-level signal in the case where the output voltage of the power supply circuit 105 is lower than a predetermined reference voltage. The AND circuit is supplied with the output voltage of the comparator and the output of the pulse generating circuit. Thus, the power monitor circuit 106 outputs a pulse signal 1061 in the case where the output voltage of the power supply circuit 105 is higher than a predetermined reference voltage or in a predetermined range of the reference voltage.

The pulse signal 1061 is input to the capacitor-type insulating section 405 as a complementary signal through an inverter circuit 404. The complementary differential pulses that have passed through the capacitor-type insulating section 405 are restored to a pulse signal by a comparator circuit 406. The pulse signal thus restored is input to a signal converter circuit 110. The signal converter circuit 110, on the other hand, is charged by a capacitor 409 through a resistor 408. The connection terminal of the series circuit of the capacitor 409 and the resistor 408 is connected to the input terminal of a comparator circuit 412, and the other terminal of the comparator circuit 412 is connected to a reference power supply Vref. The capacitor 409 is charged by the resistor 408. In the case where a pulse signal is input to the gate input terminal of a MOS switch 410, however, the MOS switch 410 repeatedly turns on and off thereby to discharge the capacitor 409. As long as the power supply circuit 105 operates normally and a pulse signal 1061 is transmitted, therefore, the voltage at the input terminal of the comparator 412 is not increased beyond Vref, so that the output of the comparator 412 remains at low level. In the case where the power supply circuit 105 fails to operate normally and no pulse signal is transmitted, on the other hand, the gate input terminal of the MOS switch 410 turns to low level and the MOS switch 410 turns off. In the process, the capacitor 406 is charged by the resistor 408, and the input terminal voltage of the comparator 412 increases beyond Vref, so that the output of the comparator 412 turns to high level. In this way, the state signal of the power supply circuit 105 is transferred to the microcomputer 111.

The standby signal 1181 from the microcomputer 111 is input to a state signal transmitter circuit 118. As long as the power supply on the network side operates normally, a pulse signal 4061 is output from the comparator 406. This pulse signal is input to the other terminal of the state signal transmitter circuit 118, and the logic product with the standby signal is produced. Therefore, the state signal transmitter circuit 118 thus outputs a complementary pulse signal in the case where the standby signal is at high level, and a predetermined state signal in the case where the standby signal is at low level. This signal is input to a signal converter circuit 112 through the capacitor-type insulating section 405. The signal converter circuit 112 has the same function as the signal converter circuit 110 and outputs a level signal 1121 corresponding to the presence or absence of a pulse signal. The standby signal controls a network transceiver 113.

Figure 5:
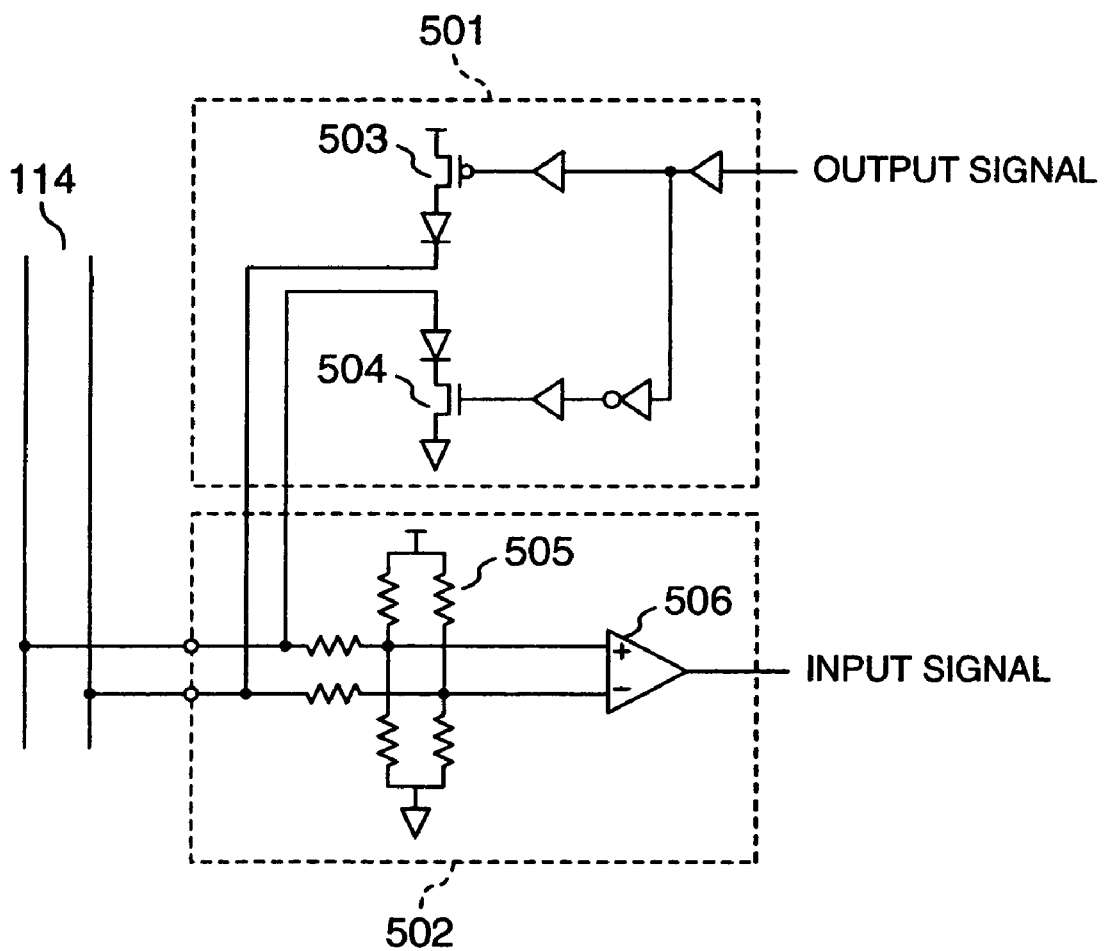
FIG. 5 is a diagram showing a configuration of the network transceiver of the interface device shown in FIG. 1.

FIG. 5 shows an example of the network transceiver. The network transceiver includes a driver circuit 501 and a receiver circuit 502 and is connected to the network 114. The network 114 communicates using digital complementary signals through two signal lines. The output driver 501 includes a PMOS transistor 503 for turning the output to high level and a NMOS transistor 504 for turning the output to low level. The output signal transmitted from the microcomputer is output to the network 500 through the driver circuit.

On the other hand, the receiver circuit 502 includes a resistor network 505 and an input comparator circuit 506. The resistor network has the function of setting the signal level by biasing the network while at the same time reducing the signal noise from the network and sending it to an internal comparator. This resistor network is connected to the power supply and constantly supplies a current, thereby posing the problem of an increased power consumption.

Figure 6:
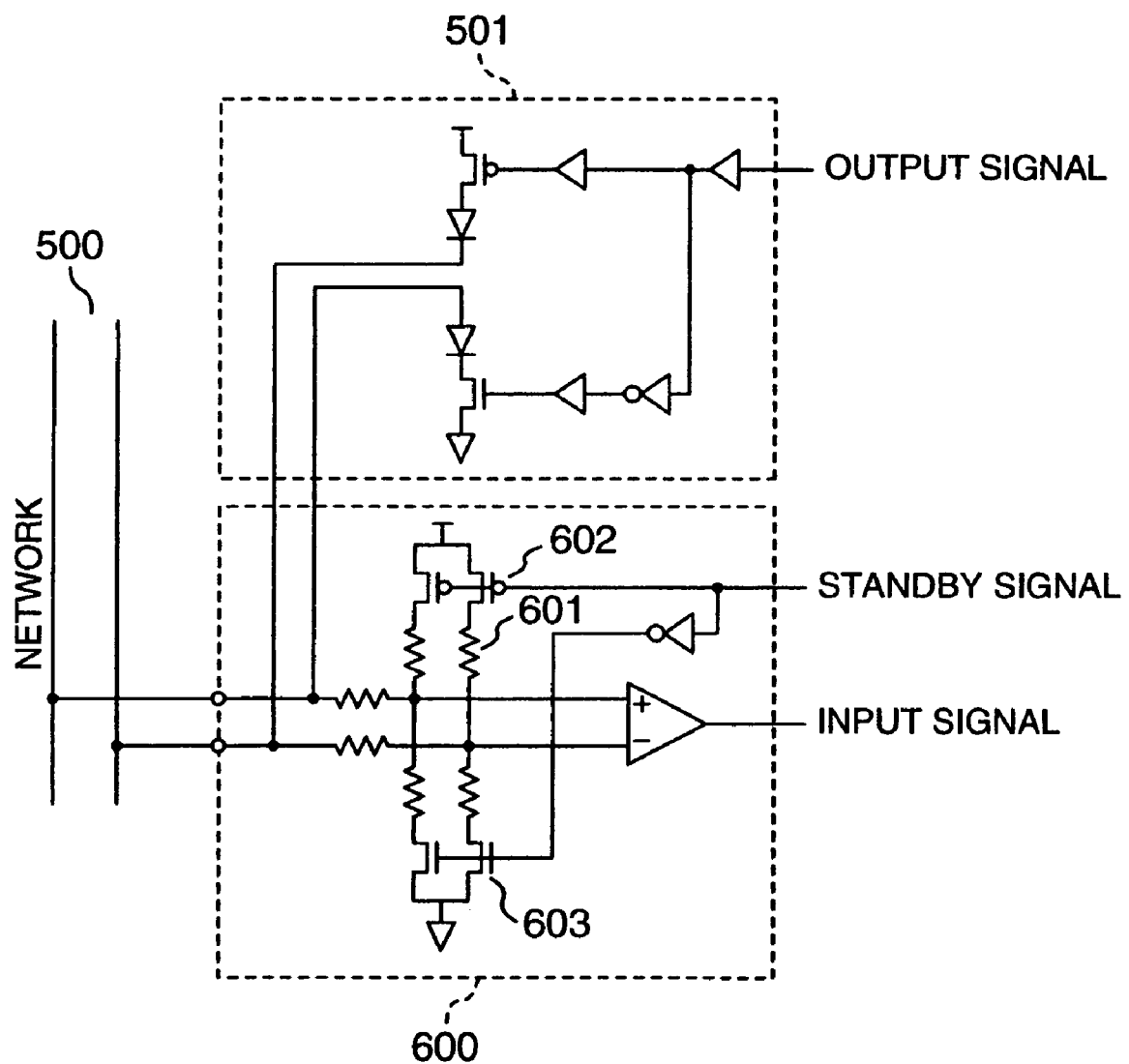
FIG. 6 is a diagram showing another configuration of the network transceiver of the interface device shown in FIG. 1.

FIG. 6 shows another configuration of the network transceiver including the same driver circuit 501 as shown in FIG. 5 and a receiver circuit with a reduced power consumption. The transceiver circuit shown in FIG. 6 is an example of the network transceiver circuit 113 shown in FIG. 1. The difference with the receiver shown in FIG. 5 is that MOS switches 602, 603 are connected in series between the resistor network 601 and the power supply. The MOS switches 602, 603 are controlled by a standby signal. In the case where a signal in standby state is transmitted from the microcomputer, the MOS switches 602, 603 both turn off and consume no DC current. In the process, the signal is neither input from nor output to the network 500. By doing so, the DC current consumption in standby mode can be reduced. The standby signal is used to control the receiver circuit through the capacitor-type insulating circuit from the microcomputer. For this system configuration is to be realized, therefore, the capacitor-type insulating circuit requires means for transmitting the state signal as described above.

A configuration for changing the power consumption of the network transceiver is described above. Nevertheless, the power consumption can be changed also by the resistor network and the MOS switch for other circuits. In a circuit operating based on a clock signal, on the other hand, the power consumption can be reduced by stopping the supply of the clock signal through a switch.

Figure 7:
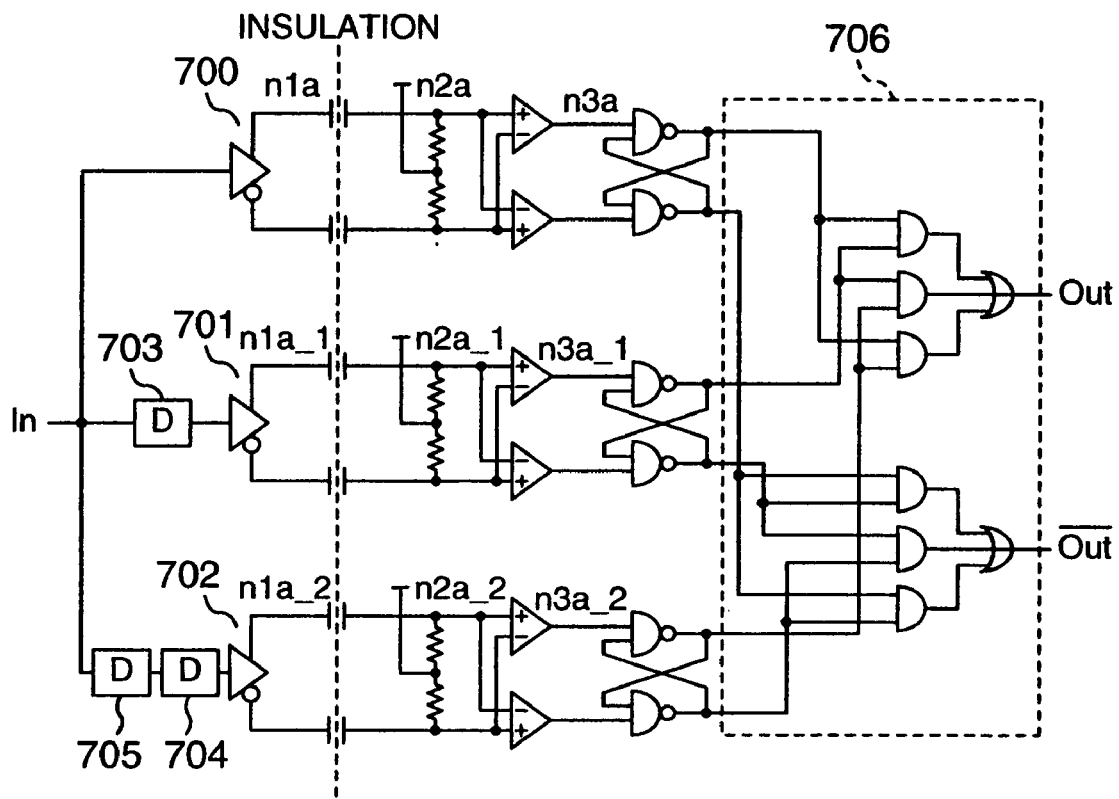
FIG. 7 is a diagram showing another configuration for propagating a state signal based on the basic configuration of FIG. 2 and waveforms generated at various portions.
Figure 7:
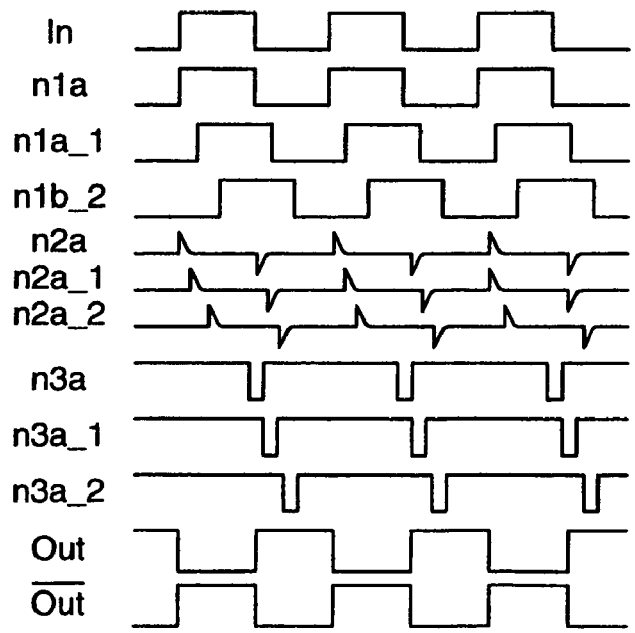

FIG. 7 is a diagram showing another configuration of the capacitor-type insulating circuit for transmitting the state signal. This is intended to improve the noise resistance of the capacitor-type insulating circuit. The capacitor-type insulating circuit uses the differential transmission, and therefore upon generation of a common noise when the signal passes through the insulation capacitor, is liable to cause a malfunction as the noise is superposed on the signal. In addition to the channel for transmitting the original signal as it is, therefore, a new channel 701 is provided for delaying the signal through a delay circuit 703 and transmitting the signal by shifting the timing of passing through the capacitor-type insulating circuit section. A transmission channel 702 is further provided for delaying the timing with respect to the channel 701 through delay circuits 705, 704. The signal transmitted through these three channels is output to the microcomputer through a majority decision circuit 706. With this configuration, even in the case where a signal of a given channel is erroneously transmitted by a noise generated at a given timing, the signal is correctly transmitted by the other two channels which transmit the signal at a different timing than the time point when the noise is generated. By deciding a majority of these three signals, the correct signal can be output.

The operation will be explained based on the timing chart of the signal shown in FIG. 7. With respect to the signal n1$a$ of the channel 700 transmitted at the same timing as the original signal IN, the signal n1$a$_1 of the channel 701 and the signal n1$a$_2 of the channel 702 are shifted in transmission timing. The signal waveforms are designated by n2$a$, n2$a$_1, n2$a$_2 that have passed through the capacitor-type insulating section, from which it is seen that the timing of the signals of the three channels are shifted from each other. Even in the case where a noise is generated at a given timing, therefore, no noise is developed at the timing of the other two channels, and therefore the signal can be correctly transmitted. As far as the signals of two out of the three channels are correctly transmitted, the correct signal can be output by majority decision.

Figure 8:
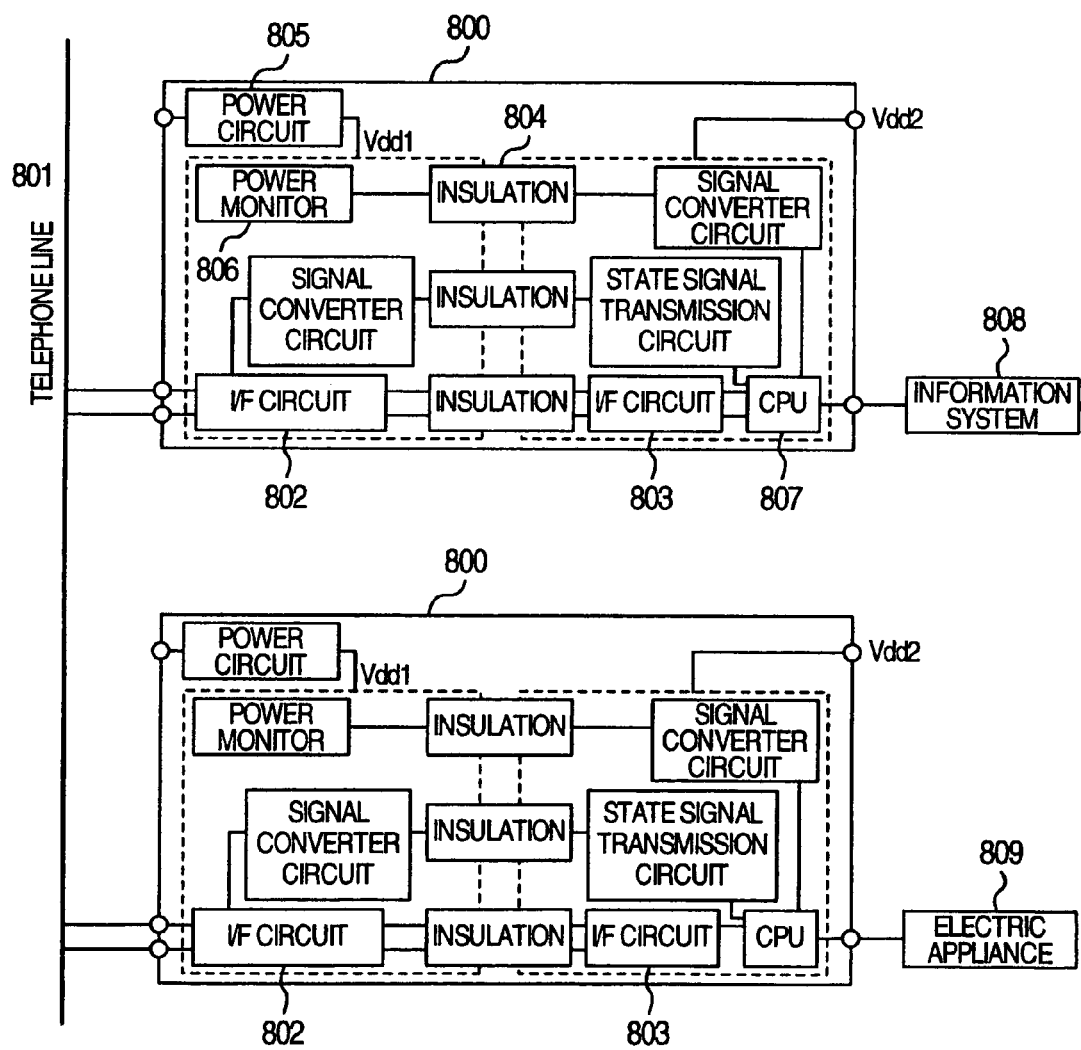
FIG. 8 is a diagram showing a configuration of another system using a capacitor-type insulating circuit.

FIG. 8 shows an embodiment to which the invention is used for a modem. A communication modem device 800 is an interface device for connecting an information control unit 808 such as a personal computer or a FAX to a telephone line 801. The communication modem 800 can connect a TV set having the communication function, a refrigerator, an air-conditioner or the like electrical appliance 809, to the telephone line 801. The communication modem 800 is configured of an interface circuit 802 connected with the telephone line and an interface circuit 803 connected with a CPU 807. The circuits 802 and 803 are electrically insulated from each other by a capacitor-type insulating circuit 804. A power supply circuit 805 for supplying power to the circuits on the telephone line is monitored by a power monitor circuit 806, and the information thereof is transmitted to the CPU 807 through the insulating circuit. The method for monitoring the power and the signal transmission is the same as the method included in the embodiment described above. Also, the state signal can be controlled by being transmitted from the CPU through the insulating circuit to the modem circuit 802 on the telephone line side.

In FIG. 8, the information processing system 808 is configured independently of the interface device 800 and the electrical appliance 809 is configured independently of the interface device 800. Nevertheless, the interface device 800 can alternatively be built in the information processing system 808 and the electrical appliance 809, respectively. In such a case, the CPU 897 of the interface device 800 may be replaced with a built-in CPU for controlling the operation of the information processing system 808 and the electrical appliance 809.

Further, the internet and the mail can be enjoyed at any place by use of a portable telephone and the information control system such as a small-sized personal computer having built therein the interface device 800. In this case, assuming that the state signal represents the residual capacity of the battery of a portable telephone connected through the capacitor-type insulating circuit, for example, the residual capacity of the portable telephone can be grasped on the part of the information system. For this purpose, the residual capacity of the battery is input to the power monitor circuit 806 from the portable telephone and sent to the CPU built in the information system by a pulse signal. By doing so, the built-in CPU can display the residual capacity of the battery of the portable telephone, the requirement to charge or the requirement to disconnect the line on the display or stop the signal transmission.

Also assume that the portable telephone can assume the normal operation mode and the low power consumption mode with power consumption suppressed by changing the illuminance, the density of display or the strength of radio wave. In accordance with the residual capacity of the battery sent thereto through the capacitor-type insulating circuit, the CPU outputs a standby signal, which is sent to the portable telephone through the capacitor-type insulating circuit, so that the portable telephone can be controlled to operate in low power consumption mode.

As described above, according to the invention, the state signal can be sent to both sides through the capacitor-type insulating circuit, thereby making it possible to provide a reliable system and a system and an information system with suppressed power consumption.

Figure 9:
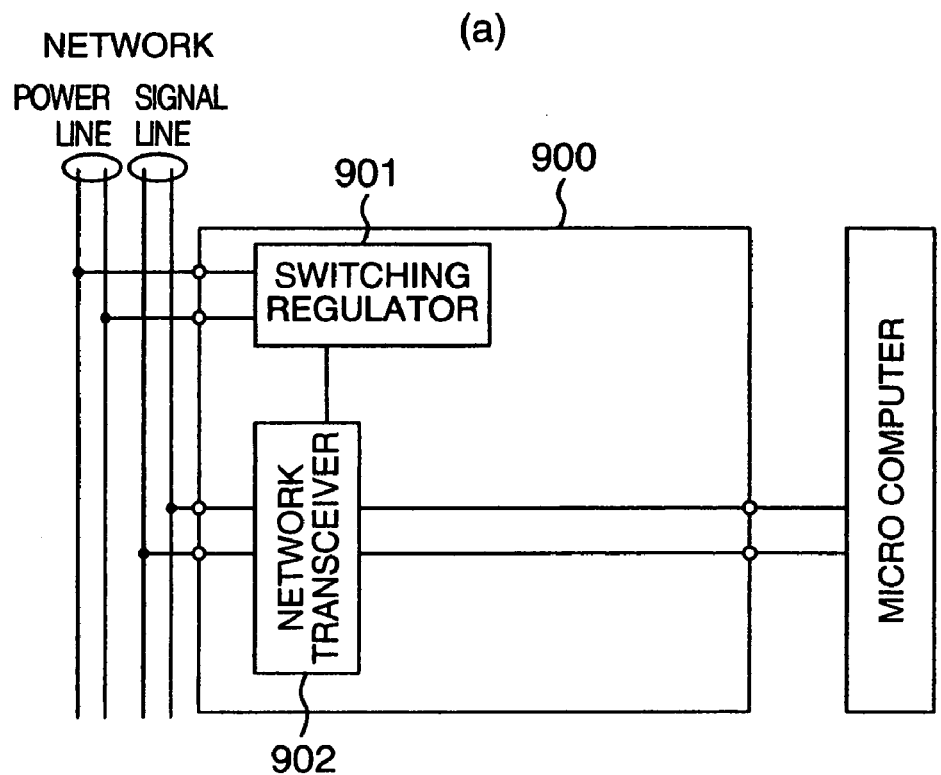
FIG. 9 is a diagram showing a configuration of a semiconductor integrated circuit device having a network transceiver and a switching regulator.
Figure 9:
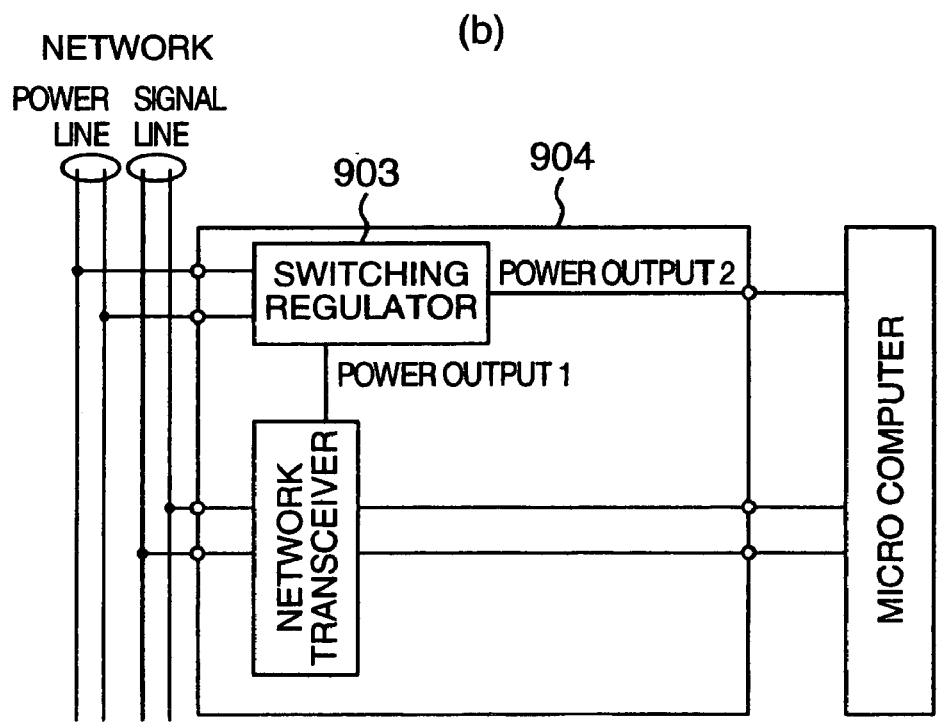

FIG. 9($a$) shows an example in which the power supply circuit 901 and the network transceiver 902 are formed on the same semiconductor integrated circuit device 900, and the power supply circuit 901 is configured of a switching regulator. The power supply circuit 901 converts the voltage supplied from the network into the internal voltage of the LSI and supplies power to the network transceiver 902. Generally, the dropper-type regulator generates a small noise but consumes large power, while the switching regulator generates a large noise but consumes less power. A plurality of network transceivers are connected to the network. Assuming that N transceivers are connected, the total power consumption of the network is N times the power consumption of one transceiver. Thus, it is important to suppress the power consumption per transceiver to a small level. Generally, the switching regulator is not used as a power supply for a single transceiver. Considering the low power consumption rate thereof, however, the power consumption per transceiver can be reduced and therefore the number of the transceivers connectable to the same network can be increased by combining the switching regulator with the network transceiver.

FIG. 9(b) shows an example in which the power supply circuit 903 and the network transceiver 902 are formed on the same semiconductor integrated circuit device 904, and the power supply circuit 903 is configured of a switching regulator. The switching regulator 903 has two outputs, of which the output 1 is connected to the power terminal of the network transceiver, and the output 2 is connected to the power terminal of the microcomputer. The microcomputer is also configured in one-to-one relation with the transceiver, and therefore, the network is connected with N times as many microcomputers. With this configuration, a network node low in power consumption can be formed, and the number of nodes that can be connected to the network can be increased.

Figure 10:
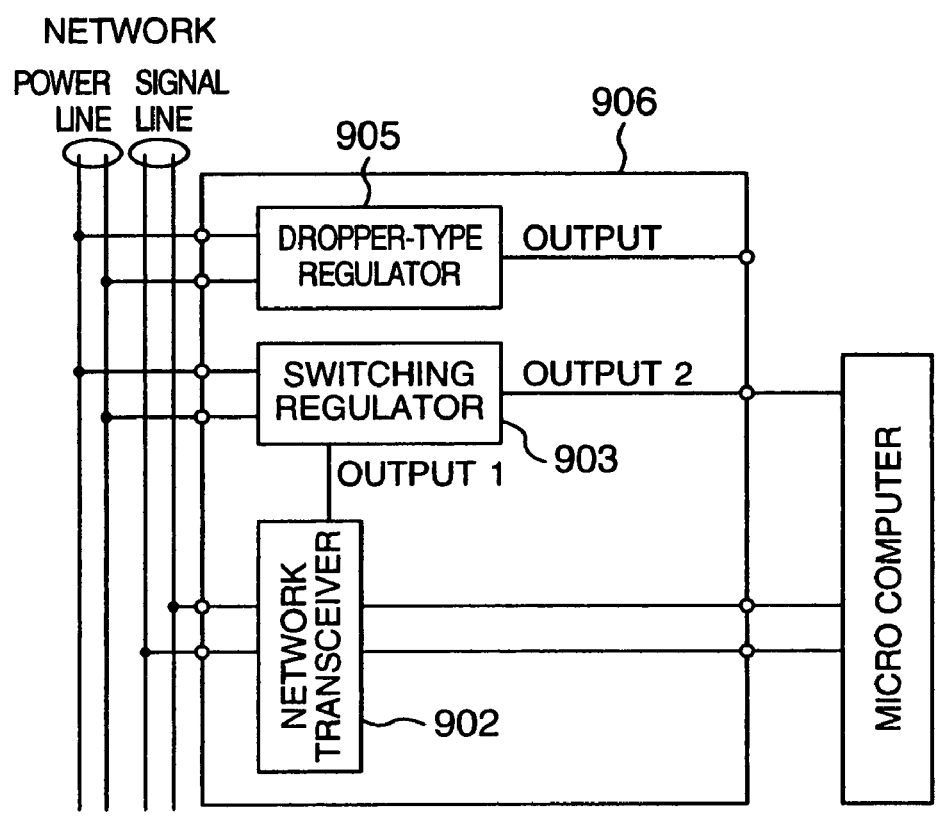
FIG. 10 is a diagram showing a configuration of a semiconductor integrated circuit device having a network transceiver, a switching regulator and a dropper-type regulator.

FIG. 10 shows an example in which the power supply circuits 903, 905 and the network transceiver 902 are formed on the same semiconductor integrated circuit device 906, the power supply circuit 903 is configured of a switching regulator and the power supply circuit 905 is configured of a dropper-type regulator. For reducing the power consumption rate, the switching regulator is a choice. Nevertheless, a low-noise power supply is sometimes required. In such a case, the provision of an independent dropper-type regulator as a low-noise power supply can produce a power supply with a low noise.

Figure 11:
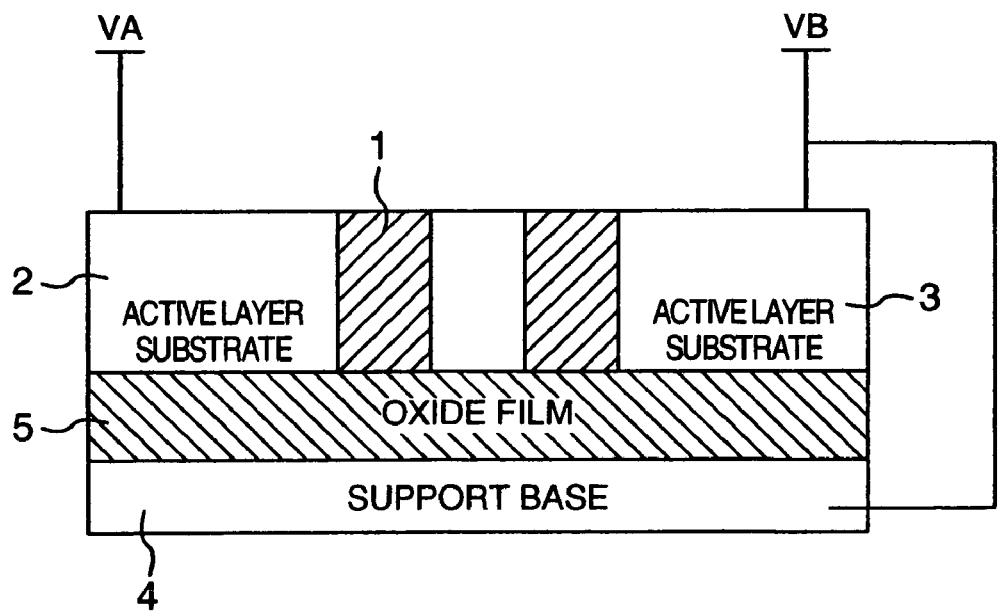
FIG. 11 is a diagram showing a configuration of a semiconductor integrated circuit device having a structure in which a support base is connected to an active layer.

FIG. 11 shows a SOI (silicon on insulator) structure in which a silicon layer is formed on an oxide film 5 on a support base 4. Insulating grooves 1 are formed on the silicone, and an active layer 2 and an active layer 3 each constituting an element are electrically insulated from each other. At the same time, the support base 4 and the active layer base 3 are connected to each other thereby to fix the potential of the support base. By doing so, the effect of variations of the electric field that the active layer base 2 might otherwise have on the active layer base 3 through the support base can be suppressed, thereby making it possible to secure stable operation of the elements formed in the active layer base 3. The support base and the active layer base are connected to each other through the SOI base or the package.

INDUSTRIAL APPLICABILITY

The invention is applicable to a control device and an information processing system having the communication function with an external device through a network or the like, whereby a highly reliable communication can be carried out with a small circuit size.

What is claimed is:

1. An interface device comprising a first area formed of a plurality of circuits, a second area formed of a plurality of circuits and an insulating circuit for coupling said first area and said second area through a capacitor;
wherein said first area includes a first converter circuit which converts a state signal into a pulse signal, and said second area includes a second converter circuit which converts a pulse signal output from said first converter circuit and transmitted through said insulating circuit, into a new state signal.

2. An interface device according to claim 1, wherein said first converter circuit includes a pulse signal generating circuit for generating a pulse signal and a logic circuit which outputs the product of the state signal of the circuit formed in said first area and the pulse signal from said pulse signal generating circuit.

3. An interface device according to claim 1, wherein said second converter circuit includes a MOS transistor which controls a voltage to high/low level in accordance with the pulse signal transmitted thereto through said insulating circuit, and a comparator circuit which compares the high/low-level voltage controlled by said MOS transistor with a reference voltage.

4. An interface device according to claim 1, wherein said insulating circuit includes a buffer circuit which generates a complementary pulse signal from the pulse signal input thereto, a differentiation circuit formed of a capacitor and a resistor, a comparator circuit which converts the complementary differential waveform generated by said differentiation circuit into a complementary pulse signal, and a flip-flop for generating a pulse signal input to said insulating circuit from the complementary pulse signal generated by said comparator circuit.

5. An interface device according to claim 1, wherein said state signal has selected one of a constant level and a slowly changing level.

6. An interface device according to claim 1, wherein said second area includes a third converter circuit which converts a state signal into a pulse signal, and said first area includes a fourth converter circuit which converts the pulse signal output from said third converter circuit and transmitted thereto through said insulating circuit, into a new state signal.

7. An interface device according to claim 1, wherein at least one of a plurality of the circuits formed in said first area is a power supply circuit which supplies a voltage to the other circuits, and the state signal input to said first converter circuit is output from said power supply circuit.

8. An interface device according to claim 1, wherein at least one of a plurality of the circuits formed in said second area takes an active state which operates in response to an external signal or an inactive state which does not operate in response to an external signal, and wherein at least one of a plurality of the circuits formed in said first area outputs a state signal which controls the at least one circuit formed in said second area, taking an active state or an inactive state.

9. An interface device according to claim 8, wherein said at least one circuit formed in said second area taking an active state or an inactive state is controlled by turning on/off of a voltage supplied.

10. An interface device according to claim 8, wherein said at least one circuit formed in said second area taking an active state or an inactive state is controlled by turning on/off of a clock signal supplied.

* * * * *